United States Patent [19]

Bauknecht et al.

[11] Patent Number: 4,792,879
[45] Date of Patent: Dec. 20, 1988

[54] MOUNTING STRUCTURE FOR ELECTRIC AND ELECTRONIC CIRCUIT ELEMENTS

[75] Inventors: Otto Bauknecht, Meckenbeuren; Norbert Lichte, Schlier; Karl-Heinz Warken, Weingarten, all of Fed. Rep. of Germany

[73] Assignee: I F M Electronic GmbH, Essen, Fed. Rep. of Germany

[21] Appl. No.: 89,042

[22] Filed: Aug. 24, 1987

Related U.S. Application Data

[63] Continuation of Ser. No. 723,798, Apr. 16, 1985, abandoned.

[30] Foreign Application Priority Data

Apr. 17, 1984 [DE] Fed. Rep. of Germany ....... 3414480

[51] Int. Cl.$^4$ .............................................. H05K 9/00
[52] U.S. Cl. ................................. 361/424; 174/35 R; 361/398
[58] Field of Search ............... 174/35 R; 339/17 F; 361/395, 399, 398, 424

[56] References Cited

U.S. PATENT DOCUMENTS

| | | | |
|---|---|---|---|
| 1,641,395 | 9/1927 | Moore | 361/424 |
| 3,106,603 | 11/1963 | Webb | 174/35 R |
| 3,200,361 | 8/1965 | Schwartz et al. | 361/399 |
| 3,258,650 | 6/1966 | Fiege | 361/424 |
| 3,659,205 | 4/1972 | Cooke et al. | 361/424 |
| 3,873,889 | 3/1975 | Leyba | 361/398 |
| 4,481,559 | 11/1984 | Buck et al. | 361/398 |

FOREIGN PATENT DOCUMENTS 2262729 7/1974 Fed. Rep. of Germany ...... 361/398

OTHER PUBLICATIONS

Horton, "Flexible Laminated Tape Cable Connector", IBM Tech. Dis. Bul., vol. 5 No. 11, 4/63, pp. 47-48.

*Primary Examiner*—A. D. Pellinen
*Assistant Examiner*—Gregory D. Thompson
*Attorney, Agent, or Firm*—Browdy and Neimark

[57] ABSTRACT

A proximity switch or contactless switch circuit comprises within a casing a flexible insulating carrier provided along a component side with a multiplicity of electronic components connected by conductive strips to form the contactless or proximity switch circuit. An extension of the carrier or the opposite side of the carrier are provided with continuous conductive coatings so that when the carrier is folded or rolled within the casing, a portion of the carrier strip provided with the coating or layer forms an additional shield.

5 Claims, 3 Drawing Sheets

MOUNTING STRUCTURE FOR ELECTRIC AND ELECTRONIC CIRCUIT ELEMENTS

This application is a continuation of application Ser. No. 723,798, filed Apr. 16, 1985, now abandoned.

FIELD OF THE INVENTION

Our present invention relates to a mounting structure for electric and electronic circuit elements and, more particularly, to circuitry which is sensitive to external noise and perturbations. The invention is especially significant in the field of electronic contactless (proximity) switches.

BACKGROUND OF THE INVENTION

It is known to provide a mounting structure for circuit elements in the form of a carrier of a flexible electrically insulating material formed on a surface with conductive strips effecting electrical connection between the circuit elements which are arranged on one side of the carrier. The carrier with the elements mounted thereon can be folded and/or rolled to minimize the volume occupied by the structure.

Such circuits can be provided in a variety of forms. For the purposes of the present invention, these circuits will be understood to be contactless (proximity) switches utilizing the principles set forth in U.S. Pat. Nos. 4,193,023 and 4,225,748, for example, so that the circuit elements can include externally affected oscillators or switching amplifiers, an oscillator or switching-amplifier controllable electronic switch, e.g. a transistor, a thyristor, a triac, etc., and a supply circuit for delivering the supply voltage for the oscillator and/or the switching amplifier.

Electronic proximity switching devices are required to deal with a number of electrical problems, e.g. the generation of the supply voltage, improvement of the oscillator or amplifier, switching pulse delay and short circuit resistance. They must also deal with a number of mechanical problems, an important one of which is the provision of the circuit elements in the smallest amount of space or, for a given space, the inclusion of the greatest number of circuit components.

In the circuit arrangement described in German patent document laid-open application DE-OS No. 19 40 373, these problems are partially solved by providing the electronic component carrier in a folded or rolled condition so that the components lie in a different planes within the housing. The space within the housing is optimally used and a high packing density is achieved with respect to the components.

A high packing density for electronic components can also be achieved with the arrangement described in German Pat. No. 31 23 372 (see U.S. Pat. No. 4,481,559) when the components on the thin carrier are applied on opposite sides of a flat auxiliary support. Here too a number of planes are provided for the arrays of the components and the housing space is better utilized.

In these systems, the conductive strips can be provided on the component side of the carrier, thereby affording the advantage that the carrier itself can form an insulating layer on the opposite side.

Electrical circuits of the type with which the present invention is concerned are extremely sensitive to external perturbation fields so that the need for shielding plays an important role in the design of such circuits. For this reason a metal housing or a housing with a high degree of shielding is generally provided. However, it has been found to be advisable to provide the circuitry with electronic shielding independently of the casing or housing.

SUMMARY OF THE INVENTION

It is, therefore, the principal object of the present invention to provide a circuit structure of the aforedescribed type and for circuitry of the proximity-switch type especially, in which an especially high packing density of the electronic components can be obtained while the shielding problem is solved in a relatively elegant manner Another object of this invention is to provide a highly shielded electronic circuit of the contactless-switch or proximity-switch type whereby drawbacks of prior art devices are obviated.

According to a first aspect of the invention, these objects are attained by providing the component carrier on the side thereof turned away from the component side with a substantially continuous electrically conductive layer which is electrically insulated from any conductive strips provided on the carrier. The invention is based upon the fact that the folded arrangement of the carrier and the components provided thereon can afford a high packing density when, in addition, the surface of the carrier opposite that provided with the electronic components is electrically conductive to form an electrically conductive layer surrounding the components as a shielding layer.

Consequently, this coating provides a shield which is independent of the casing shield and, because it is electrically insulated from the conductive strips forming the conductors of the device, the conductive coating has no detrimental effects. The conductive layer or coating is best constituted by a thin copper or like coating of a type common in printed circuitry.

Since the conductive strips can be applied to the component side of the carrier, the insulation of these conductive strips against the conductive layer poses no problem since the carrier itself is effectively the insulation which is required. If, of course, the conductive strips are provided on the opposite surface of the carrier it is necessary to provide an additional insulating layer between the conductive layer and the conductive strips.

It has already been pointed out that it is advantageous in providing a compact circuit structure utilizing flexible carriers to dispose, within the pace in which the component carrier is rolled or folded, a generally flat support member along the opposite sides of which the carrier strip is applied, with the component side turned outwardly away from this auxiliary support. This teaching is also used in accordance with the present invention and, in accordance with this invention, the auxiliary support is covered on both of its opposite faces by the carrier strip and, specifically, on the surfaces of the folded carrier strip opposite that along which the components are provided.

According to the invention, moreover, at least two additional folds are provided so that two portions of the carrier strip have their component sides turned toward the outwardly facing component sides of the portions of the strip applied to the auxiliary carrier, so that the conductive layer on the noncomponent sides of the carrier strips lie outwardly and shield the relatively dense packing of components thus formed. Because the components are disposed at a number of levels, the assembly insures a dense packing of the components in the given space.

According to another aspect of the invention, the carrier strip is extended into a length without components but which length is nevertheless provided with the conductive coating, this length then being folded around at least a portion of the compact assembly provided by the component-carrying portion of the carrier strip, thereby providing a shield around this assembly. This extension of the carrier can partly or completely enclose the component-carrying portions of the strip in its folded arrangement.

The coating on the extension of the carrier strip can be applied to the surface opposite that upon which the components are provided, although it is also possible in addition or alternatively to provide the coating on the component side of the extension.

When the coating is provided on the side opposite that along which the components are provided, the conductive strips can also be provided on the side opposite that carrying the components. In the latter case the coating can be spaced from the conductive strips, but it is applied in the same operation as when the conductive strips are applied.

According to another feature of the invention, when the carrier is applied to two sides of an auxiliary support, the extension or prolongation of the carrier, provided with the shielding coating, is not bonded to the support but is independently foldable or bendable therearound and around the component-carrying portions of the carrier which are applied to this support.

With the provision of a flexible folded component carrier according to the invention, with or without an extension strip in the manner described, the side of the carrier turned away from the component side or a portion of the extension strip can be provided with a light-emitting diode which can be easily viewed through an opening in the housing. This diode can be used to show energization of the circuitry or a ready state or operational state thereof.

BRIEF DESCRIPTION OF THE DRAWINGS

The above and other objects, features and advantages of the present invention will become more readily apparent from the following description, reference being made to the accompanying drawings in which.

DESCRIPTION OF PREFERRED EMBODIMENTS

Figure 1:
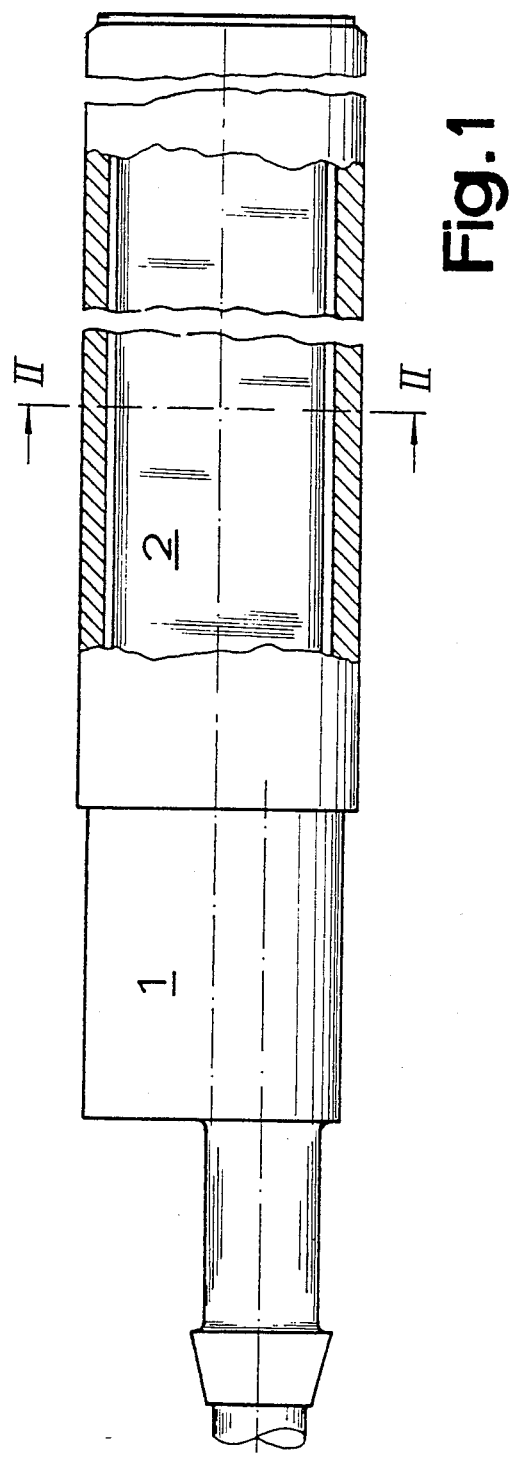
FIG. 1 is a section through a casing, which can be provided with the circuit arrangement according to the present invention.

FIG. 1 represents a proximity-switch, especially a contactless inductive switch in accordance with the invention, this switch comprising a housing 1 and a circuit carrier 2 disposed in a folded state within the housing 1. The circuit carrier 2 can be composed of metal or ferrite to form an electrical shield.

Figure 6:
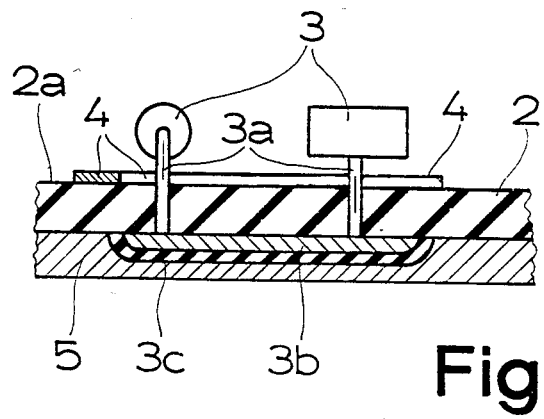
FIG. 6 is a detailed view illustrating an example combination of elements according to the invention.

As can be seen from FIG. 6, the carrier 2 may be an insulating layer provided on one side, i.e. the component side 2a, with a multiplicity of electronic components 3 whose connectors 3a may extend through the insulating flexible carrier 2 to be connected by conductive strips, one of which can be seen at 3b in FIG. 6. A layer 3c of insulating material is applied and a conductive layer 5 is thereupon applied to the opposite side of the carrier. The insulating layer 3c extends into a tongue or extension 7, which is likewise provided with this conductive layer. For general illustration purposes, conductive paths or strips have been represented at 4.

Referring again to FIG. 2, it will be apparent that the carrier 2 is folded and is provided with a multiplicity of electronic or electrical components 3 interconnected by the conductive paths or strips 4 into an electrical circuit, the details of which have not been illustrated but which can provide the proximity switch of, for example, U.S. Pat. Nos. 4,193,023 or 4,225,748. Other proximity switches have been mentioned therein as well.

Figure 2:
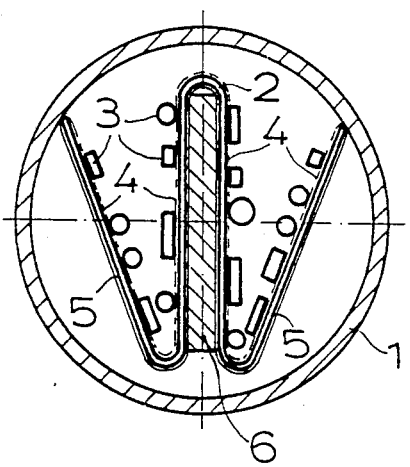
FIG. 2 is a transverse section along the section II—II through the casing of FIG. 1, illustrating one embodiment of a circuit support arrangement.

Since the carrier 2 is a flexible electrically insulating material, it can be folded and, in the embodiment illustrated in FIG. 2, three folds are provided, i.e. the carrier 2 is applied to opposite surfaces of an auxiliary support 6 to which it is bonded by an adhesive.

Since the outer conductive layer 5 is of copper or another conductive coting, its freely exposed surfaces form an additional shielding for the densely packed arrangement of the components shown in FIG. 2.

In the embodiment of FIG. 2 (see also FIG. 6) the insulating carrier 2 can form an electrical insulation between conductive paths or strips 4 on the component side 2a of the carrier.

The conductive layer 5 shields the components 3 of the circuit against external perturbation fields.

The auxiliary carrier or support 6 is fully covered on both of its broad surfaces with the carrier 2. The portions on the carrier 2 which are not bonded to the support 6 are folded back over the supported regions to increase the packing density and provide, in effect, a four-plane arrangement of the components.

Figures 3, 4:
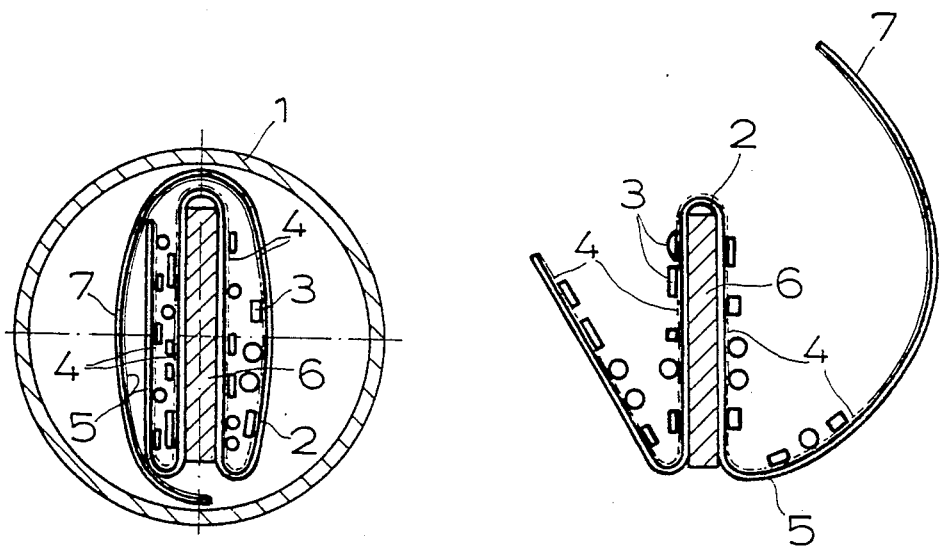
FIG. 3 is a similar section illustrating another embodiment of the invention.
FIG. 4 is a section through an assembly showing the arrangement of FIG. 3 removed from its casing, but in an embodiment in which the shielding conductive layer is on the component side of the carrier.
Figure 5:
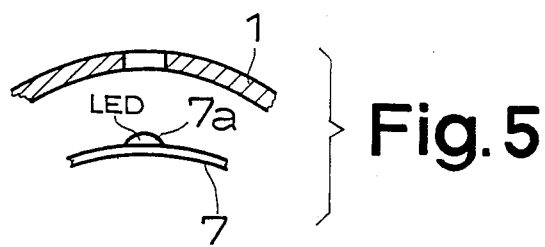
FIG. 5 is a detail view showing a light-emitting diode supported by an extension of the insulating carrier with its conductive layer, in the system of FIGS. 3 and 4.

In the embodiment of FIG. 3, a four-plane arrangement of the components is likewise shown, although here an extension or tongue is provided on the carrier 2 as represented at 7, this extension being additionally folded or extended around the densely packed arrangement as shown in FIG. 3, and the conductive layer 5 is provided on the inner surface of the carrier 2 but spaced from any conductive paths 4 thereof. The fabrication of this system is relatively simple since the conductive coating 5 can be applied at the same time as the conductive strips 4. When the assembly is removed from the casing 1, the intrinsic elasticity allows the assembly to spring open somewhat, as has been illustrated in FIG. 4. FIG. 5 shows that the extension or tongue 7 can support an LED 7a which is visible through an opening in the casing.

We claim:

1. An electrical contactless switch, comprising:
   a casing;
   a flexible strip-like insulating carrier, including a first part having conductive strips provided thereon, and a flexible extension along a common edge from said first part with an electrically conductive layer coated thereon;

electronic components mounted on a component side of said first part of said carrier and being electrically connected by said conductive strips to form a circuit of said contactless switch;

said first part of said carrier being folded into folds in accordion fashion to form a compact assembly, with vertices of said folds being parallel to said common edge of said first part and said extension; and said extension being wrapped around said assembly in the form of a wrapping, with an axis of said wrapping being parallel to said vertices of said folds to form an electrical shield for said assembly; wherein said wrapping with said assembly is inserted into said casing.

2. The switch of claim 1, said wrapping being open at opposing ends thereof.

3. The switch of claim 1, wherein a flat auxiliary support is provided within said casing, and said first part of said carrier is at least in part bonded to opposite sides of said support, said support thus forming a part of said compact assembly, and said extension being free from attachment to said support.

4. The switch of claim 1, said casing and said wrapping being cylindrical.

5. The switch of claim 1, wherein said electrically conductive layer on said extension extends on said first part of said carrier, on a surface of said carrier opposite said component side, to form an extended electrical shield for said assembly.

* * * * *